US008832509B2

(12) United States Patent  (10) Patent No.: US 8,832,509 B2
Yoon  (45) Date of Patent: Sep. 9, 2014

(54) SEMICONDUCTOR SYSTEM AND DATA TRAINING METHOD THEREOF

(75) Inventor: Sang Sic Yoon, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 660 days.

(21) Appl. No.: 12/970,578

(22) Filed: Dec. 16, 2010

(65) Prior Publication Data

US 2012/0030153 A1 Feb. 2, 2012

(30) Foreign Application Priority Data

Jul. 29, 2010 (KR) .................. 10-2010-0073311

(51) Int. Cl.
*G11C 29/00* (2006.01)
*H03M 13/00* (2006.01)
*G11C 29/02* (2006.01)
*G06F 11/07* (2006.01)
*G06F 11/16* (2006.01)
*G11C 29/12* (2006.01)

(52) U.S. Cl.
CPC ........... *G11C 29/02* (2013.01); *G06F 11/07* (2013.01); *G06F 11/0766* (2013.01); *G06F 11/167* (2013.01); *G06F 1/0772* (2013.01); *G11C 29/12015* (2013.01); *G11C 29/023* (2013.01); *G11C 29/028* (2013.01)
USPC .......................................... 714/718; 714/758

(58) Field of Classification Search
CPC .... G11C 29/02; G11C 29/023; G11C 29/028; G11C 29/12015; G06F 11/07; G06F 11/0766; G06F 11/0772; G06F 11/1674
USPC ................................................ 714/718, 758
See application file for complete search history.

(56) References Cited

U.S. PATENT DOCUMENTS

| 2006/0107150 | A1* | 5/2006 | Onodera .................. 714/733 |
| 2009/0049267 | A1* | 2/2009 | Perner et al. ............. 711/170 |
| 2009/0067260 | A1 | 3/2009 | Yang et al. |
| 2009/0116311 | A1 | 5/2009 | Bae |
| 2009/0119419 | A1 | 5/2009 | Bae et al. |
| 2009/0319840 | A1* | 12/2009 | Hara et al. ............... 714/718 |
| 2010/0271887 | A1 | 10/2010 | Kwak et al. |
| 2010/0281302 | A1* | 11/2010 | Earle et al. ................ 714/32 |
| 2011/0185256 | A1* | 7/2011 | Nygren et al. ............ 714/758 |

FOREIGN PATENT DOCUMENTS

| JP | 2009-117025 | 5/2009 |
| KR | 1020080050908 A | 6/2008 |
| KR | 1020090028538 A | 3/2009 |

OTHER PUBLICATIONS

Chin-Lung Su; Yi-Ting Yeh; Cheng-Wen Wu; , "An integrated ECC and redundancy repair scheme for memory reliability enhancement," Defect and Fault Tolerance in VLSI Systems, 2005. DFT 2005. 20th IEEE International Symposium on , vol., no., pp. 81-89, Oct. 3-5, 2005.*

Mitra, S.; Seifert, N.; Zhang, M.; Shi, Q.; Kim, K.S.; , "Robust system design with built-in soft-error resilience," Computer , vol. 38, No. 2, pp. 43-52, Feb. 2005.*

* cited by examiner

*Primary Examiner* — Cynthia Britt
(74) *Attorney, Agent, or Firm* — William Park & Associates Patent Ltd.

(57) ABSTRACT

A semiconductor system includes a semiconductor memory configured to determine whether an error has occurred in a data pattern and generate an error signal, and a memory controller configured to provide the data pattern to the semiconductor memory and perform data training with respect to the semiconductor memory using the error signal.

28 Claims, 6 Drawing Sheets

SEMICONDUCTOR SYSTEM AND DATA TRAINING METHOD THEREOF

CROSS-REFERENCES TO RELATED APPLICATION

The present application claims priority under 35 U.S.C. §119(a) to Korean Patent Application No. 10-2010-0073311, filed on Jul. 29, 2010, in the Korean Intellectual Property Office, which is incorporated herein by reference in its entirety as if set forth in full.

BACKGROUND

1. Technical Field

The present invention relates to a semiconductor system, and more particularly, to a semiconductor system and a data training method thereof.

2. Related Art

As a semiconductor memory operates at a high speed, data training is important for a semiconductor system, which includes the semiconductor memory and a memory controller for controlling the semiconductor memory, in order to exchange data with accuracy.

A data training method of a typical semiconductor system will be described with reference to FIG. 1 below.

FIG. 1 is a flowchart illustrating a typical data training method. In FIG. 1, command CMD and address ADD channel training is performed.

A memory controller writes a specific data pattern in a multi-purpose register (MPR) of a semiconductor memory using an address channel.

The memory controller performs read training for reading data recorded in the MPR of the semiconductor memory to determine whether the read data matches a data pattern and searching for the center of the read data.

Then, the memory controller performs write training for writing data through a data channel and adjusting the positions of write data and a write strobe signal DQS according to whether the write data matches the read data.

After the above-described training process is completed, normal data read/write is possible between the semiconductor memory and the memory controller.

However, in the related art as described above, the MPR is necessarily provided in the semiconductor memory.

Therefore, the circuit area of the semiconductor memory is increased by the MPR and a data pattern is limited.

SUMMARY

Accordingly, there is a need for an improved semiconductor system and method capable of performing data training even without using a multi-purpose register (MPR), which may obviate the above-mentioned problems. It should be understood, however, that some aspects of the disclosure may not necessarily obviate the problem. In the following disclosure, certain aspects and embodiments will become evident. It should be understood that these aspects and embodiments are merely exemplary, and the invention, in its broadest sense, could be practiced without having one or more features of these aspects and embodiments.

In one aspect of the present invention, a semiconductor system includes: a semiconductor memory configured to determine whether an error has occurred in a data pattern and generate an error signal; and a memory controller configured to provide the data pattern to the semiconductor memory and perform data training with respect to the semiconductor memory using the error signal.

In another aspect of the present invention, a semiconductor system includes: a plurality of semiconductor memories configured to generate an error signal in response to a training mode signal; and a memory controller configured to generate the training mode signal for activating the error signal at a desired timing and perform data training with respect to one of the semiconductor memories using the error signal.

In further another aspect of the present invention, a data training method of a semiconductor system, which includes a memory controller and a semiconductor memory that determines whether an error has occurred in a data pattern provided by the memory controller and provides an error signal to the memory controller, the data training method includes: an error signal training step in which the memory controller detects an activation time point of the error signal outputted from the semiconductor memory; and a write data training step in which the memory controller detects a deactivation duration of the error signal by shifting the data pattern from the detected activation time point of the error signal.

In yet another aspect of the present invention, a data training method of a semiconductor system, which includes a memory controller and a plurality of semiconductor memories that determine whether an error has occurred in a data pattern provided by the memory controller and provide an error signal to the memory controller, the data training method includes the steps of: providing by the memory controller a training mode signal to the plurality of semiconductor memories such that the error signal is activated at a desired timing; activating by one of the plurality of semiconductor memories the error signal in response to the training mode signal; and detecting by the memory controller a deactivation duration of the error signal by shifting the data pattern from an activation time point of the error signal.

In still another aspect of the present invention, a semiconductor system includes: a plurality of semiconductor memories configured to perform one of an operation for forcedly activating an error signal and an operation for activating the error signal by comparing an internal error check value with an external error check value in response to a training mode signal; and a memory controller configured to provide the plurality of semiconductor memories with a data pattern and the external error check value corresponding to the data pattern, separately provide the plurality of semiconductor memories with the training mode signal according to whether training is performed, and perform data training with respect to one of the plurality of semiconductor memories using the error signal.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

According to an embodiment of the present invention, write training is possible using an error signal pin CRC Alert Pin, which is provided in a semiconductor system having an error check function such as a cyclic redundancy check (CRC) function in order to alert a data communication error, even without a mufti-purpose register (MPR).

Hereinafter, a semiconductor system and a data training method thereof according to the present invention will be described in detail with reference to the accompanying drawings through exemplary embodiments.

Figure 1:
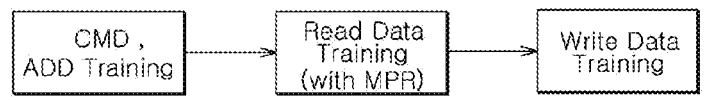
FIG. 1 is a flowchart illustrating a typical data training method.
Figure 2:
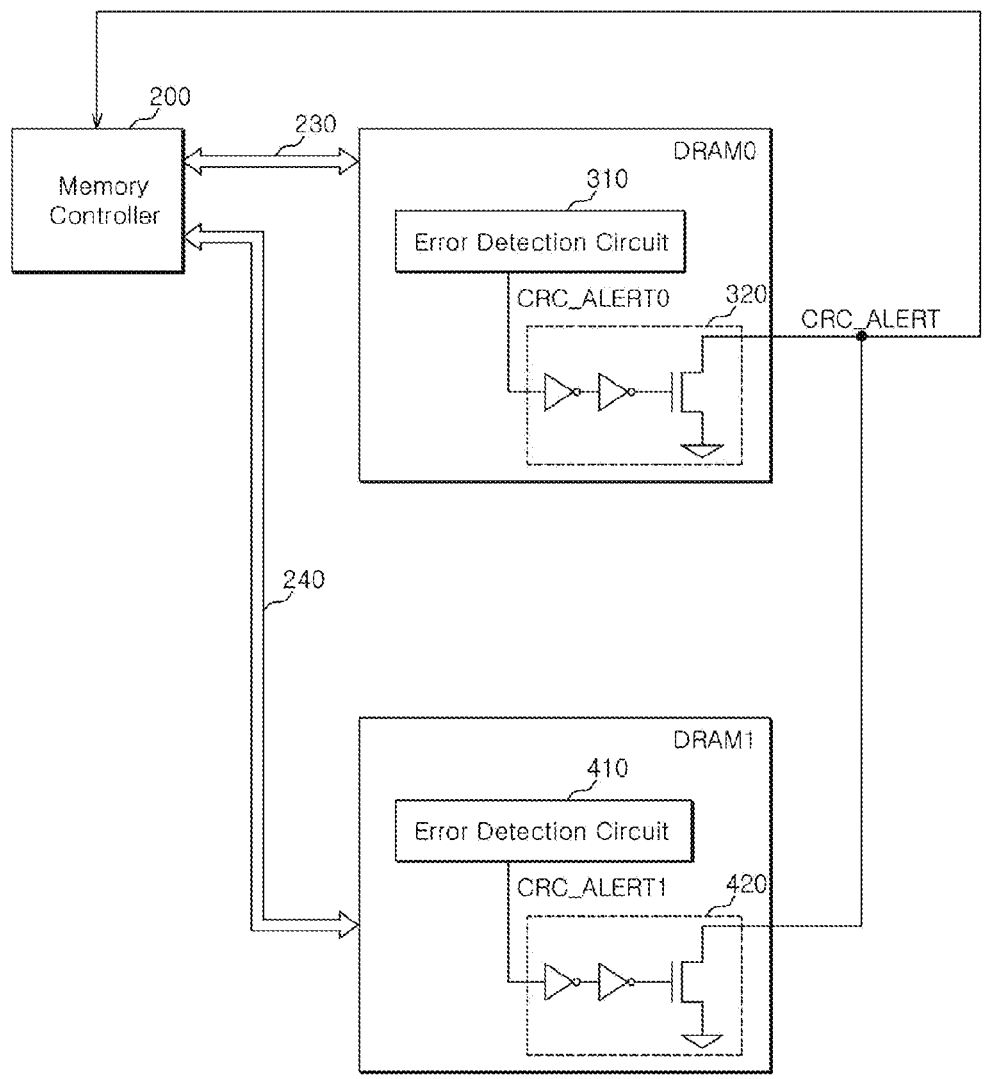
FIG. 2 is a block diagram of a semiconductor system according to an embodiment of the present invention.

FIG. 2 is a block diagram of a semiconductor system according to an embodiment of the present invention. Referring to FIG. 2, a semiconductor system 100 according to the embodiment includes a memory controller 200, a plurality of semiconductor memories, a first communication channel 230, and a second communication channel 240.

The plurality of semiconductor memories comprise a first semiconductor memory DRAM0 and a second semiconductor memory DRAM1, while the number of the semiconductor memories may vary depending on the memory capacity, the circuit design method and the like.

The memory controller 200 is configured to control a write training operation and a read training operation for the first semiconductor memory DRAM0 and the second semiconductor memory DRAM1 using a variation in the transitioning point of an error signal CRC_ALERT.

The memory controller 200 provides the plurality of semiconductor memories DRAM0 and DRAM1 with address, command, data and error check information through the first communication channel 230 and the second communication channel 240.

The plurality of semiconductor memories DRAM0 and DRAM1 provide data to the memory controller 200 through the first communication channel 230 and the second communication channel 240.

Furthermore, the plurality of semiconductor memories DRAM0 and DRAM 1 provide the memory controller 200 with the error signal CRC_ALERT through an error signal pin.

The first semiconductor memory DRAM0 and the second semiconductor memory DRAM 1 are configured to determine whether an error has occurred in a data pattern provided by the memory controller 200 and generate the error signal CRC_ALERT.

The first semiconductor memory DRAM0 and the second semiconductor memory DRAM 1 are configured to record data or output the recorded data under the control of the memory controller 200.

The first semiconductor memory DRAM0 includes an error detection circuit 310 and a driver 320.

The error detection circuit 310 is configured to generate an internal error signal CRC_ALERT0 by comparing an internal error check value with an external error check value.

The internal error check value is generated by performing error check (that is, a CRC operation) with respect to the data pattern, which is provided by the memory controller 200, in the error detection circuit 310, and the external error check value is provided by the memory controller 200 together with the data.

The driver 320 is configured to drive the output terminal of the error signal CRC_ALERT in response to the internal error signal CRC_ALERT0.

The driver 320 includes a plurality of inverters and a transistor.

The second semiconductor memory DRAM1 includes an error detection circuit 410 and a driver 420.

The error detection circuit 410 is configured to generate an internal error signal CRC_ALERT1 by comparing an internal error check value with an external error check value.

The internal error check value is generated by performing error check (that is, a CRC operation) with respect to the data pattern, which is provided by the memory controller 200, in the error detection circuit 410, and the external error check value is provided by the memory controller 200 together with the data.

The driver 420 is configured to drive the output terminal of the error signal CRC_ALERT in response to the internal error signal CRC_ALERT1.

The driver 420 includes a plurality of inverters and a transistor.

The first semiconductor memory DRAM0, the second semiconductor memory DRAM1, and the output terminal of the error signal CRC_ALERT are commonly connected to one another.

Accordingly, between the drivers 320 and 420, a corresponding driver is configured to be electrically isolated from the output terminal when one of the internal error signals CRC_ALERT0 and CRC_ALERT1 is deactivated (for example, a low level).

Figure 3:
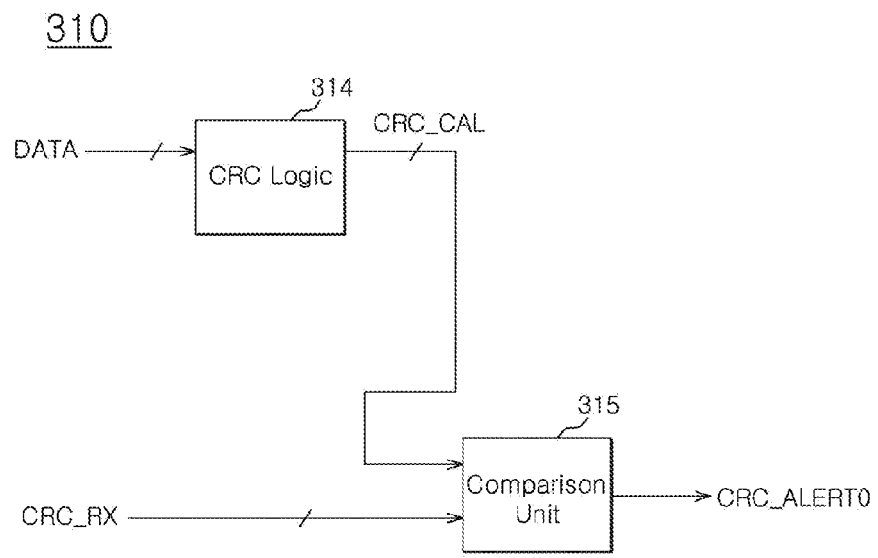
FIG. 3 is a diagram illustrating an internal configuration of the error detection circuit illustrated in FIG. 2.

FIG. 3 is a diagram illustrating an internal configuration of the error detection circuit illustrated in FIG. 2. Referring to FIG. 3, the error detection circuit 310 includes an error check logic such as a CRC logic 314, and a comparison unit 315.

The CRC logic 314 is configured to generate an internal error check value CRC_CAL by performing a CRC operation with respect to data.

The comparison unit 315 is configured to generate the internal error signal CRC_ALERT0 by comparing an external error check value CRC_RX provided by the memory controller 200 with the internal error check value CRC_CAL generated in the error detection circuit 310.

The error detection circuit 410 may have the same configuration as that of the error detection circuit 310 illustrated in FIG. 3.

Figure 4:
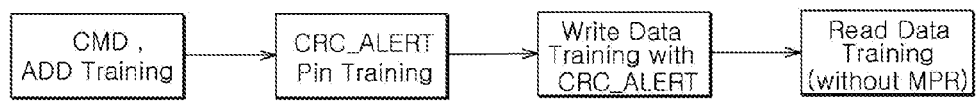
FIG. 4 is a flowchart illustrating a data training method of a semiconductor system according to an embodiment of the present invention.

FIG. 4 is a flowchart illustrating a data training method of a semiconductor system according to an embodiment of the present invention. Referring to FIG. 4, a data training operation according to the embodiment of the invention is performed in sequence for command CMD and address ADD channel training, error signal training, write data training and read data training, which will be described below.

An example in which data training is performed with respect to the second semiconductor memory DRAM1 will be described.

The command CMD and address ADD channel training is performed.

The training of an error signal pin CRC Alert Pin is performed.

Figure 5:
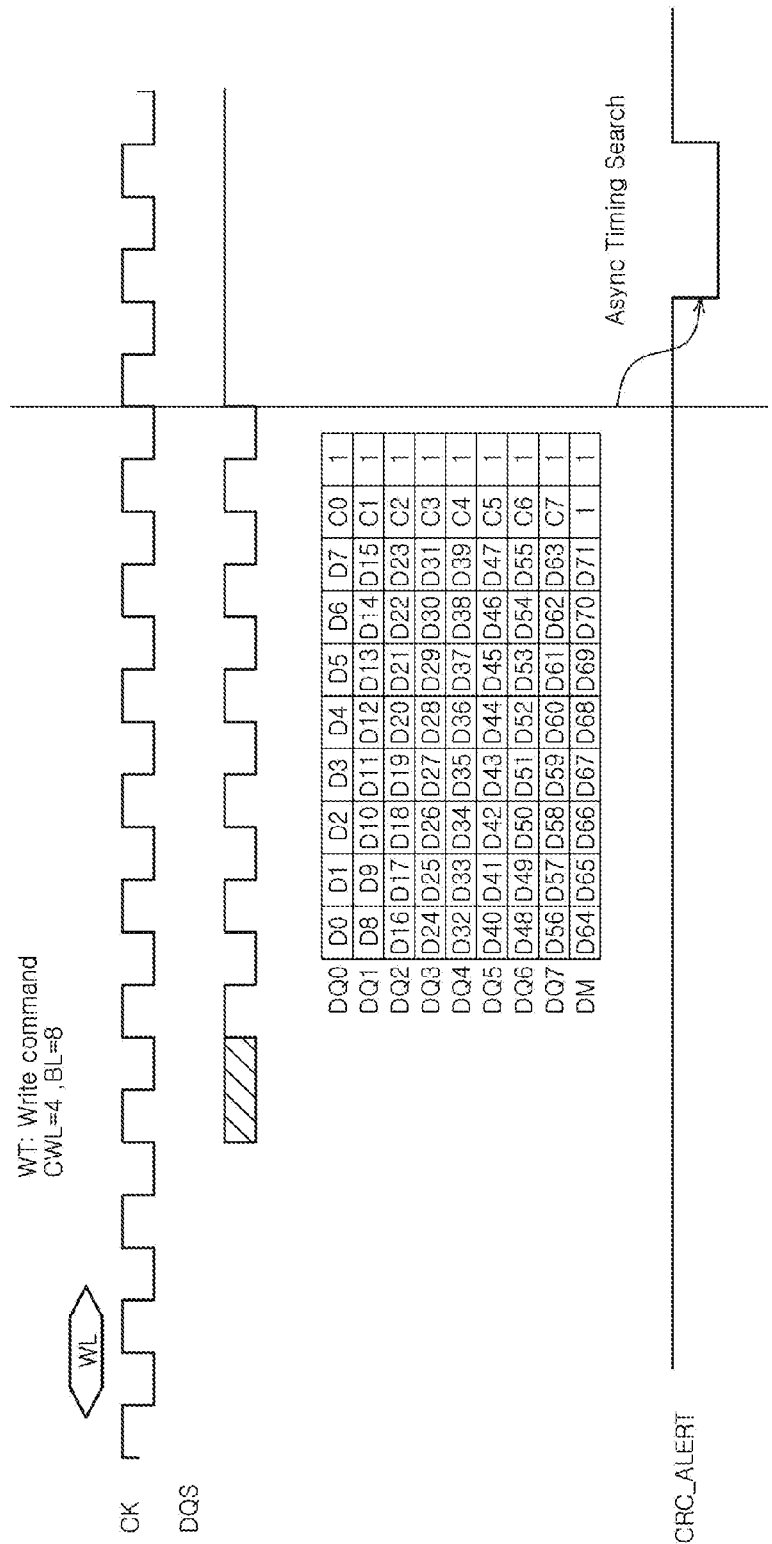
FIG. 5 is a timing diagram explaining an error signal training method according to an embodiment of the present invention.

FIG. 5 is a timing diagram explaining an error signal training method according to an embodiment of the present invention. The training of the error signal pin is an operation for searching for the timing at which data fail has occurred as illustrated in FIG. 5.

According to the operation for searching for the timing at which the fail has occurred, the second semiconductor memory DRAM1 searches for the timing at which the error signal CRC_ALERT outputted through the error signal pin is activated in response to the data pattern outputted from the memory controller 200.

The training of the error signal pin may be performed using the following two methods.

According to the first method, the memory controller 200 activates the error signal CRC_ALERT by writing various data patterns in the second semiconductor memory DRAM1.

According to the second method, the memory controller 200 activates the error signal CRC_ALERT while adjusting the timing at which data patterns are written in the second semiconductor memory DRAM1.

Figure 6:
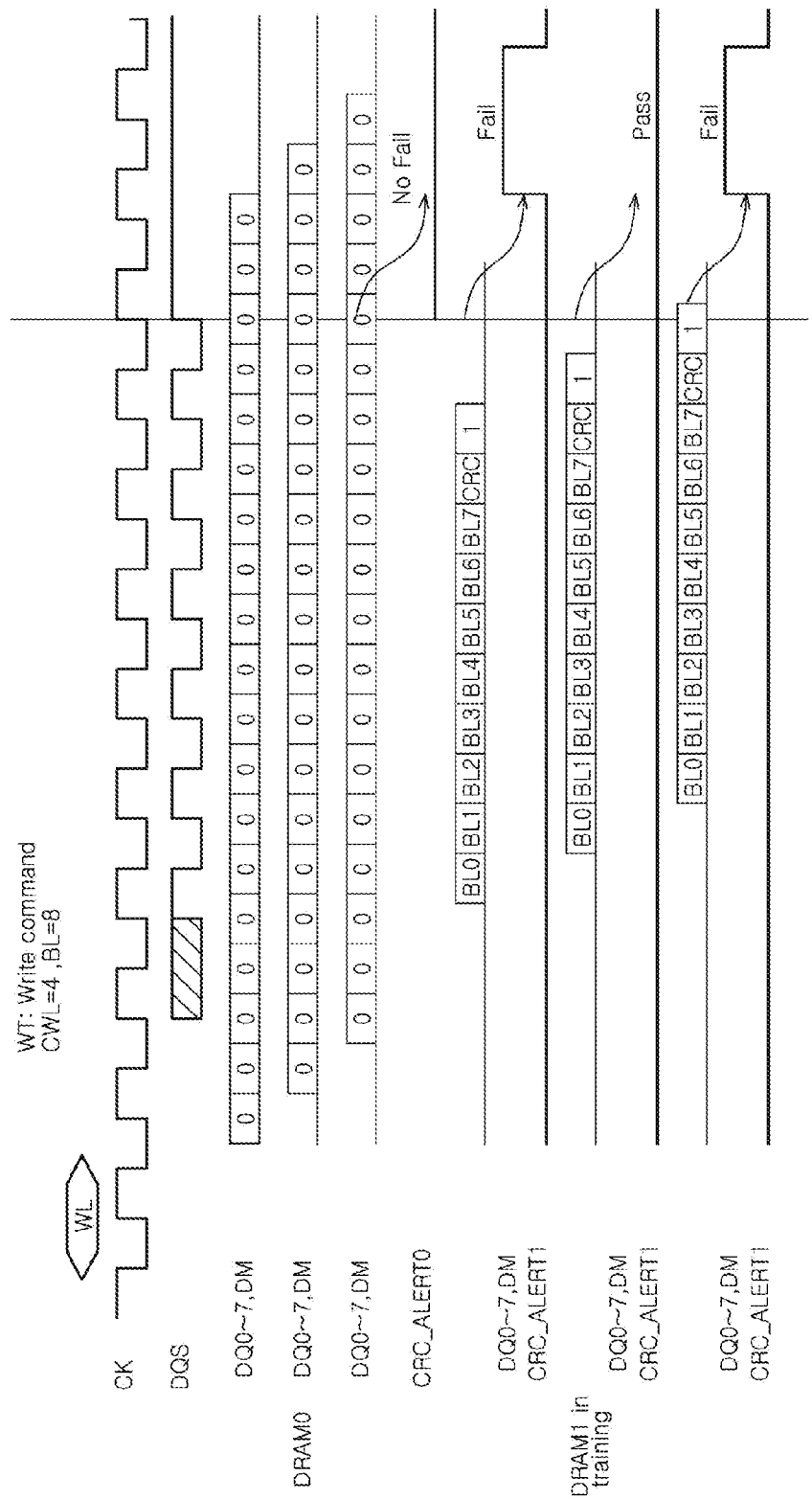
FIG. 6 is a timing diagram explaining a write training method according to an embodiment of the present invention.

Then, the write data training is performed using the error signal CRC_ALERT as illustrated in FIG. 6, which is a timing diagram explaining a write training method according to the embodiment.

The memory controller 200 writes a data pattern, in which all data bits are '0' or '1', in the first semiconductor memory DRAM0 for which no training is performed, thereby substantially preventing an occurrence of data fail. That is, the memory controller 200 allows the internal error signal CRC_ALERT0 to be deactivated.

At this time, in order to substantially prevent an occurrence of data fail more stably, '0' or '1' may be provided before and after CAS write latency CWL.

The memory controller 200 understands the occurrence timing of the data fail, that is, the activation timing of the error signal CRC_ALERT, through the training of the error signal pin.

The memory controller 200 checks a variation in the error signal CRC_ALERT, that is, a variation in the internal error signal CRC_ALERT1, while shifting the data pattern around the CAS write latency CWL.

When the internal error signal CRC_ALERT1 is activated to a high level, the error signal CRC_ALERT is activated to a low level by the driver 420 illustrated in FIG. 2.

As the data pattern is shifted from the timing at which the data fail has occurred, a deactivation duration of the internal error signal CRC_ALERT1, that is, a pass zone where a stable data write operation is possible is formed.

Accordingly, the memory controller 200 detects an intermediate time point of the pass zone to adjust the positions of the data pattern and a write strobe signal DQS, thereby completing the write data training.

While the training is being performed, the data pattern provided by the memory controller 200 is substantially prevented from being stored in memory blocks of the first semiconductor memory DRAM0 and the second semiconductor memory DRAM1 by a data mask command DM That is, while the training is being performed, the data pattern provided to the first semiconductor memory DRAM0 and the second semiconductor memory DRAM1 is provided only to the error detection circuits 310 and 410, and is not stored in the memory blocks.

Then, the memory controller 200 performs read data training for reading data recorded in the memory block of the second semiconductor memory DRAM1 to determine whether the read data matches the data pattern provided by the memory controller 200 and searching for the center of the read data.

Another embodiment of the invention is substantially identical to the embodiment of the invention illustrated in FIG. 2 in that write training is possible using the error signal pin CRC Alert Pin even without the MPR.

Unlike the embodiment of the invention illustrated in FIG. 2, according to another embodiment of the invention, data training is possible even without performing the training of the error signal pin CRC Alert Pin.

Figure 7:
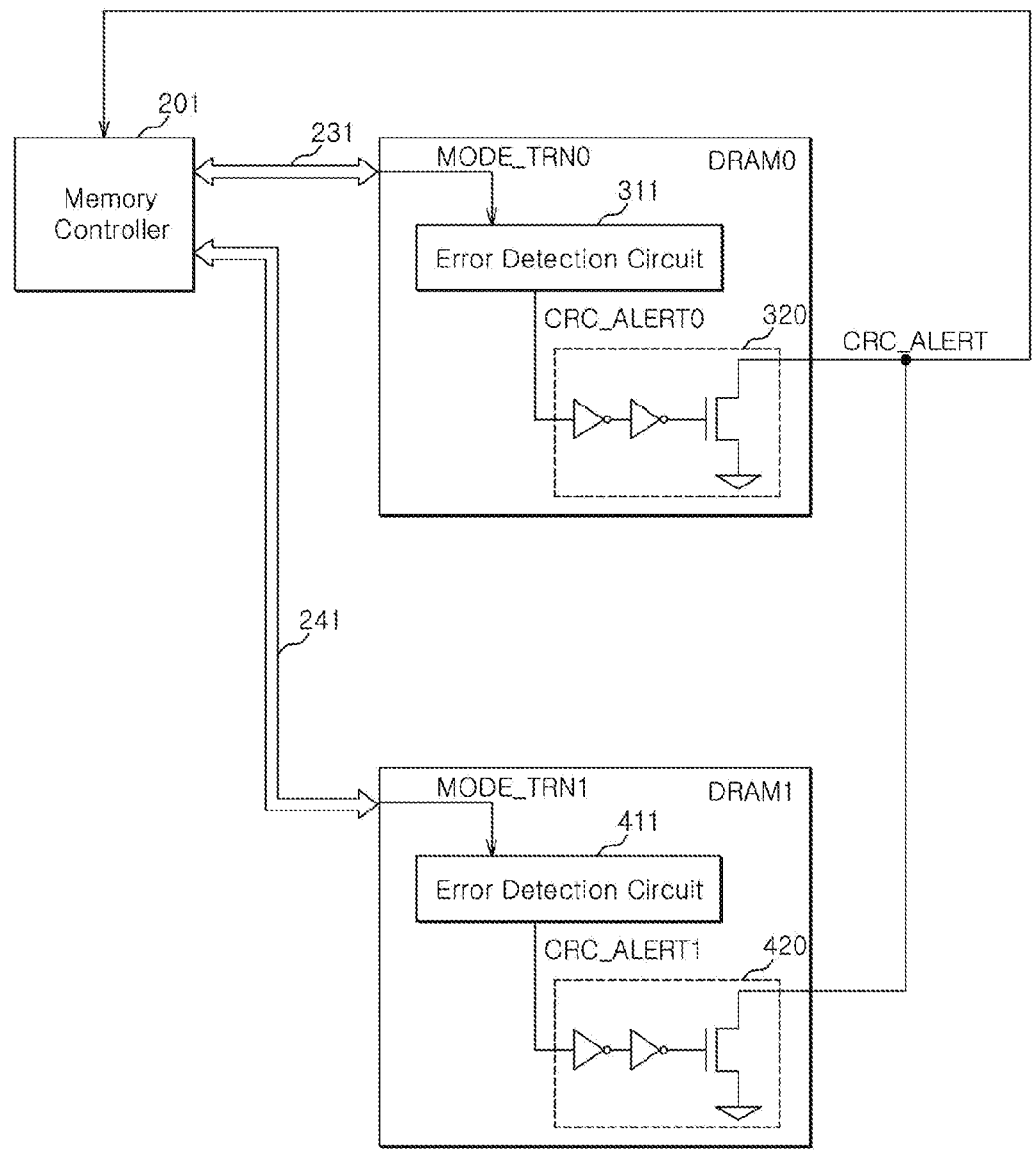
FIG. 7 is a block diagram of a semiconductor system according to another embodiment of the present invention.

FIG. 7 is a block diagram of a semiconductor system according to another embodiment of the present invention. Referring to FIG. 7, a semiconductor system 101 according to another embodiment of the invention includes a memory controller 201, a plurality of semiconductor memories, a first communication channel 231, and a second communication channel 241.

The plurality of semiconductor memories are classified as a first semiconductor memory DRAM0 and a second semiconductor memory DRAM1, and the number of the semiconductor memories may vary depending on the memory capacity, the circuit design method and the like.

The memory controller 201 is configured to control a write training operation and a read training operation for the first semiconductor memory DRAM0 and the second semiconductor memory DRAM1 using a variation in the shift time point of an error signal CRC_ALERT.

The memory controller 201 is configured to generate training mode signals MODE_TRN0 and MODE_TRN1 for activating the error signal CRC_ALERT at a desired timing.

The memory controller 201 provides the plurality of semiconductor memories DRAM0 and DRAM1 with address, command, data, error check information and the training mode signals MODE_TRN0 and MODE_TRN1 through the first communication channel 231 and the second communication channel 241.

The plurality of semiconductor memories DRAM0 and DRAM1 provide data to the memory controller 201 through the first communication channel 231 and the second communication channel 241.

Furthermore, the plurality of semiconductor memories DRAM0 and DRAM1 provide the memory controller 201 with the error signal CRC_ALERT through an error signal pin.

The first semiconductor memory DRAM0 and the second semiconductor memory DRAM 1 are configured to determine whether an error has occurred in a data pattern provided by the memory controller 201 and generate the error signal CRC_ALERT.

The first semiconductor memory DRAM0 and the second semiconductor memory DRAM1 are configured to record data or output the recorded data under the control of the memory controller 201.

The first semiconductor memory DRAM0 includes an error detection circuit 311 and a driver 320.

The error detection circuit 311 is configured to perform one of an operation for forcedly activating an internal error signal CRC_ALERT0 and an operation for activating the internal error signal CRC_ALERT0 by comparing an error check value generated in the first semiconductor memory DRAM0 with an error check value, which is provided by the memory controller 201, according to the training mode signal MODE_TRN0.

The driver 320 is configured to drive the output terminal of the error signal CRC_ALERT in response to the internal error signal CRC_ALERT0.

The driver 320 includes a plurality of inverters and a transistor.

The second semiconductor memory DRAM1 includes an error detection circuit 411 and a driver 420.

The error detection circuit 411 is configured to perform one of an operation for forcedly activating an internal error signal CRC_ALERT1 and an operation for activating the internal error signal CRC_ALERT1 by comparing an error check value generated in the second semiconductor memory DRAM1 with an error check value, which is provided by the memory controller 201, according to the training mode signal MODE_TRN1.

The driver 420 is configured to drive the output terminal of the error signal CRC_ALERT in response to the internal error signal CRC_ALERT1.

The driver 420 includes a plurality of inverters and a transistor.

The first semiconductor memory DRAM0, the second semiconductor memory DRAM1, and the output terminal of the error signal CRC_ALERT are commonly connected to one another.

Accordingly, between the drivers 320 and 420, a corresponding driver is configured to be electrically isolated from the output terminal when one of the internal error signals CRC_ALERT0 and CRC_ALERT1 is deactivated (for example, a low level).

Figure 8:
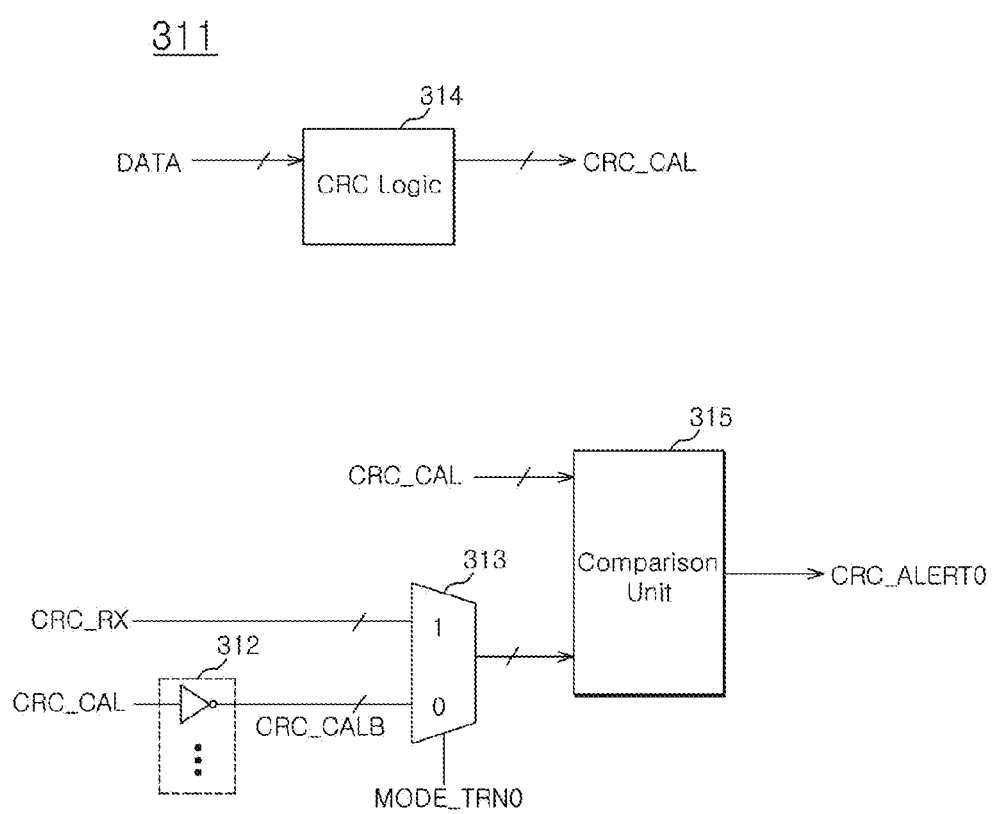
FIG. 8 is a diagram illustrating an internal configuration of the error detection circuit illustrated in FIG. 7.

FIG. 8 is a diagram illustrating an internal configuration of the error detection circuit illustrated in FIG. 7. Referring to FIG. 8, the error detection circuit 311 includes an error check logic, that is, a CRC logic 314, a comparison unit 315, an inverter array 312, and a multiplexer 313.

The CRC logic 314 is configured to generate an internal error check value CRC_CAL by performing a CRC operation with respect to data.

The inverter array 312 is configured to invert and output the internal error check value CRC_CAL.

The multiplexer 313 is configured to output an external error check value CRC_RX provided by the memory controller 201 or an inverted internal error check value CRC_CALB in response to the training mode signal MODE_TRN0.

When the training mode signal MODE_TRN0 is at a low level, that is, has a logic value of '0', the multiplexer 313 outputs the inverted internal error check value CRC_CALB.

When the training mode signal MODE_TRN0 is at a high level, that is, has a logic value of '1', the multiplexer 313 outputs the external error check value CRC_RX provided by the memory controller 201.

The comparison unit 315 is configured to generate the internal error signal CRC_ALERT0 by comparing the external error check value CRC_RX provided by the memory controller 201 with the output of the multiplexer 313.

The error detection circuit 411 may have the same configuration as that of the error detection circuit 311 illustrated in FIG. 8.

A data training operation of the semiconductor system having the above-described configuration according to another embodiment of the invention will be described below.

The data training operation according to another embodiment of the invention may be performed in the same manner as the data training operation according to the embodiment of the invention illustrated in FIG. 6, except that the training of the error signal pin CRC Alert Pin is omitted.

In the embodiment of the invention, the training of the error signal pin is performed as illustrated in FIG. 5.

However, in another embodiment of the invention, it is possible to omit the training of the error signal pin because the error signal CRC_ALERT is activated at a desired timing through the configuration as illustrated in FIG. 8.

When it is assumed that data training is performed with respect to the first semiconductor memory DRAM0, the memory controller 201 outputs the training mode signal MODE_TRN0 at the low level to forcedly activate the internal error signal CRC_ALERT1.

That is, referring to FIG. 8, since the training mode signal MODE_TRN0 is at the low level, the multiplexer 313 outputs the inverted internal error check value CRC_CALB.

The comparison unit 315 outputs the internal error signal CRC_ALERT0 by comparing the internal error check value CRC_CAL with the inverted internal error check value CRC_CALB.

Since the internal error check value CRC_CAL has a phase opposite to that of the inverted internal error check value CRC_CALB, the internal error signal CRC_ALERT0 is activated to a high level.

As described above, it is possible for the memory controller 210 to perform the write data training and the read data training using the error signal CRC_ALERT activated at a desired timing.

According to the embodiment of the invention, no MPR is used because write training is possible using an error signal, so that a circuit area can be reduced and a desired data pattern can be used in data training.

While certain embodiments have been described above, it will be understood to those skilled in the art that the embodiments described are by way of example only. Accordingly, the semiconductor system and the data training method thereof described herein should not be limited based on the described embodiments. Rather, the semiconductor system and the data training method thereof described herein should only be limited in light of the claims that follow when taken in conjunction with the above description and accompanying drawings.

What is claimed is:

1. A semiconductor system comprising:
   a semiconductor memory configured to generate an error signal when the semiconductor memory determines an error has occurred in the data pattern provided by the memory controller and to transmit the error signal through an error signal pin; and
   a memory controller configured to provide the data pattern to the semiconductor memory, to receive the error signal through the error signal pin, and to perform data training with respect to the semiconductor memory
   wherein the data training further comprises the memory controller writing a data pattern having binary data bits in the semiconductor memory to prevent a data fail,
   further wherein the error signal pin is configured to send the error signal through the error signal pin to the memory controller to alert the memory controller that there is a data communication error.

2. The semiconductor system according to claim 1, wherein the semiconductor memory includes an error detection circuit which is configured to generate the error signal by comparing an internal error check value generated by performing error check with respect to the data pattern with an external error check value provided by the memory controller.

3. The semiconductor system according to claim 1, wherein the semiconductor memory comprises:
   an error check logic configured to generate an internal error check value by performing an error check operation with respect to the data pattern; and
   a comparison unit configured to generate the error signal by comparing the internal error check value with an external error check value.

4. The semiconductor system according to claim 1, wherein the memory controller is configured to perform the data training with respect to the semiconductor memory using a variation of a value of the error signal.

5. The semiconductor system according to claim 1, wherein the memory controller is configured to perform the data training by detecting a deactivation duration of the error signal in response to repeated adjusting of a transmission timing of the data pattern.

6. The semiconductor system according to claim 1, wherein the memory controller is configured to provide an address, a command and an error check information to the semiconductor memory through a communication channel coupled between the memory controller and the semiconductor memory.

7. A semiconductor system comprising:
a plurality of semiconductor memories configured to generate an error signal in response to a training mode signal, and to transmit the error signal through an error signal pin; and
a memory controller configured to generate the training mode signal to activate the error signal forcedly at a desired timing, receive the error signal through the error signal pin, and perform data training with respect to one of the semiconductor memories using the error signal,
wherein the data training further comprises the memory controller writing a data pattern having binary data bits in the semiconductor memory to prevent a data fail,
further wherein the error signal pin is configured to send the error signal through the error signal pin to the memory controller to alert the memory controller that there is a data communication error.

8. The semiconductor system according to claim 7, wherein the semiconductor memory comprises:
an error detection circuit configured to perform one of an operation for forcedly activating an internal error signal and an operation for activating the internal error signal by comparing an internal error check value with an external error check value, which is provided by the memory controller, according to the training mode signal; and
a driver configured to generate the error signal by driving an error signal output terminal in response to the internal error signal.

9. The semiconductor system according to claim 8, wherein the error detection circuit comprises:
an error check logic configured to generate the internal error check value by performing an error check operation with respect to a data pattern provided by the memory controller;
an inverter array configured to invert the internal error check value and output an inverted internal error check value;
a multiplexer configured to output the external error check value or the inverted internal error check value in response to the training mode signal; and
a comparison unit configured to generate the internal error signal by comparing the external error check value with output of the multiplexer.

10. The semiconductor system according to claim 7, wherein the memory controller is configured to perform the data training with respect to one of the plurality of semiconductor memories using a variation of a value of the error signal.

11. The semiconductor system according to claim 7, wherein the memory controller is configured to perform the data training by detecting a deactivation duration of the error signal wherein the deactivation duration includes a pass zone where a stable data write operation is formed, and further wherein the memory controller detects an intermediate time point of the pass zone to adjust a position of the data pattern and to a write strobe signal to complete the data training.

12. The semiconductor system according to claim 7, wherein the memory controller is configured to provide a specific data pattern to a semiconductor memory, for which no training is performed, of the plurality of semiconductor memories, and substantially prevent the error signal from being activated by the semiconductor memory for which no training is performed.

13. The semiconductor system according to claim 7, wherein the memory controller is configured to provide an address, a command and an error check information to each of the plurality of semiconductor memories through each communication channel coupled between the memory controller and the plurality of semiconductor memories.

14. A data training method of a semiconductor system including a memory controller and a semiconductor memory that is configured to determine when an error has occurred in a data pattern provided by the memory controller to generate an error signal,
wherein the semiconductor memory provides an error signal to the memory controller through an error signal pin
further wherein the error signal pin is configured to send the error signal through the error signal pin to the memory controller to alert the memory controller that there is a data communication error,
the data training method comprising: an error signal training step in which the memory controller detects an activation timing of the error signal; and a write data training step in which the memory controller detects a deactivation duration of the error signal wherein the deactivation duration includes a pass zone where a stable data write operation is formed, and further wherein the memory controller detects an intermediate time point of the pass zone to adjust a position of the data pattern and to a write strobe signal to complete the write data training step.

15. The data training method according to claim 14, wherein, in the error signal training step, the memory controller provides the semiconductor memory with data patterns different from one another to activate the error signal.

16. The data training method according to claim 14, wherein, in the error signal training step, the memory controller activates the error signal by adjusting a timing at which the data pattern is provided to the semiconductor memory.

17. The data training method according to claim 14, wherein the write data training step further comprises a step of adjusting a transmission timing of the data pattern and a write strobe signal by detecting an intermediate timing of the deactivation duration of the error signal.

18. The data training method according to claim 14, wherein the memory controller is configured to provide an address, a command and an error check information to the semiconductor memory through a communication channel coupled between the memory controller and the semiconductor memory.

19. A data training method of a semiconductor system including a memory controller and a plurality of semiconductor memories that is configured to determine when an error has occurred in a data pattern provided by the memory controller to generate an error signal, wherein the semiconductor memories provide an error signal to the memory controller through an error signal pin, further wherein the error signal pin is configured to send the error signal through the error signal pin to the memory controller to alert the memory controller that there is a data communication error, the data training method comprising the steps of:
providing by the memory controller a training mode signal to the plurality of semiconductor memories such that the error signal is activated forcedly at a desired timing;
activating by one of the plurality of semiconductor memories the error signal in response to the training mode signal; and
detecting by the memory controller a deactivation duration of the error signal wherein the deactivation duration includes a pass zone where a stable data write operation is formed, and further wherein the memory controller detects an intermediate time point of the pass zone to adjust a position of the data pattern and to a write strobe signal.

20. The data training method according to claim 19, further comprising a step of providing a specific data pattern to a semiconductor memory, for which no training is performed, of the plurality of semiconductor memories, and substantially preventing the error signal from being activated by the semiconductor memory for which no training is performed.

21. The data training method according to claim 19, further comprising a step of adjusting a transmission timing of the data pattern and a write strobe signal by detecting an intermediate timing of the detected deactivation duration of the error signal.

22. The data training method according to claim 19, wherein the memory controller is configured to provide an address, a command and an error check information to each of the plurality of semiconductor memories through each communication channel coupled between the memory controller and the plurality of semiconductor memories.

23. A semiconductor system comprising:
a plurality of semiconductor memories configured to perform one of an operation for forcedly activating an error signal, and an operation for activating the error signal by comparing an internal error check value with an external error check value in response to a training mode signal, and transmit the error signal through an error signal pin; and
a memory controller configured to provide the plurality of semiconductor memories with a data pattern and the external error check value corresponding to the data pattern, receive the error signal through the error signal pin, separately provide the plurality of semiconductor memories with the training mode signal according to whether training is performed, and perform data training with respect to one of the plurality of semiconductor memories using the error signal, wherein the data training further comprises the memory controller writing a data pattern having binary data bits in the semiconductor memory to prevent a data fail,
further wherein the error signal pin is configured to send the error signal through the error signal pin to the memory controller to alert the memory controller that there is a data communication error.

24. The semiconductor system according to claim 23, wherein each semiconductor memory comprises:
an error check logic configured to generate the internal error check value by performing an error check operation with respect to the data pattern;
an inverter array configured to invert the internal error check value and output an inverted internal error check value;
a multiplexer configured to output the external error check value or the inverted internal error check value in response to the training mode signal;
a comparison unit configured to generate the internal error signal by comparing the external error check value with output of the multiplexer; and
a driver configured to activate the error signal in response to the internal error signal.

25. The semiconductor system according to claim 23, wherein the memory controller is configured to perform the data training with respect to one of the plurality of semiconductor memories using a variation of a value of the error signal.

26. The semiconductor system according to claim 23, wherein the memory controller is configured to perform the data training by detecting a deactivation duration of the error signal wherein the deactivation duration includes a pass zone where a stable data write operation is formed, and further wherein the memory controller detects an intermediate time point of the pass zone to adjust a position of the data pattern and to a write strobe signal.

27. The semiconductor system according to claim 23, wherein the memory controller is configured to provide a specific data pattern to a semiconductor memory, for which no training is performed, of the plurality of semiconductor memories, and substantially prevent the error signal from being activated by the semiconductor memory for which no training is performed.

28. The semiconductor system according to claim 23, wherein the memory controller is configured to provide an address, a command and an error check information to each of the plurality of semiconductor memories through each communication channel coupled between the memory controller and the plurality of semiconductor memories.

* * * * *